:::

United States Patent [19]
Padgett et al.

[11] 3,986,042
[45] Oct. 12, 1976

[54] CMOS BOOLEAN LOGIC MECHANIZATION

[75] Inventors: Clarence W. Padgett, Westminster; James A. Luisi, Anaheim; Dana C. Street, Placentia, all of Calif.

[73] Assignee: Rockwell International Corporation, El Segundo, Calif.

[22] Filed: Dec. 23, 1974

[21] Appl. No.: 535,643

[52] U.S. Cl. .............................. 307/205; 307/207; 307/214; 307/217; 307/218
[51] Int. Cl.² ................. H03K 19/08; H03K 19/12; H03K 19/28; H03K 19/38
[58] Field of Search ........... 307/205, 207, 215, 251, 307/218, 214, 217

[56] References Cited
UNITED STATES PATENTS

| | | | |
|---|---|---|---|
| 3,356,858 | 12/1967 | Wanlass | 307/205 |
| 3,577,005 | 5/1971 | Christensen | 307/205 |
| 3,676,705 | 7/1972 | Meyer | 307/251 |
| 3,691,401 | 9/1972 | Forlani et al. | 307/207 X |
| 3,769,523 | 10/1973 | Suzuki | 307/205 |
| 3,829,710 | 8/1974 | Hirasawa et al. | 307/215 X |
| 3,890,512 | 6/1975 | Kumakawa et al. | 307/207 X |

OTHER PUBLICATIONS

Boleky et al., "High–Performance Low–Power CMOS Memories Using Silicon–On–Sapphire Technology," IEEE J. Solid–State Circuits, vol. SC–7, pp. 135–145, 4/1972, As Reprinted in *Semiconductor Memories*, IEEE Press, pp. 84–94, 1972.

*Primary Examiner*—John S. Heyman
*Assistant Examiner*—Larry N. Anagnos
*Attorney, Agent, or Firm*—H. Fredrick Hamann; G. Donald Weber, Jr.; Morland Charles Fischer

[57] ABSTRACT

Unique, relatively simplified circuits employing complementary metal oxide semiconductor transistors and suitable diode means to mechanize the Boolean functions A·B̄ and A+B̄ and combinations thereof. In a preferred embodiment, the transistors and diodes may be fabricated by silicon-on-sapphire integrated circuit techniques. The circuits obviate the need for a conventional NOR or NAND gate which is common to logic gating arrangements of the prior art. Hence, the number of components and the corresponding cost of the circuit are reduced while the operating speed thereof is increased.

15 Claims, 10 Drawing Figures

:::

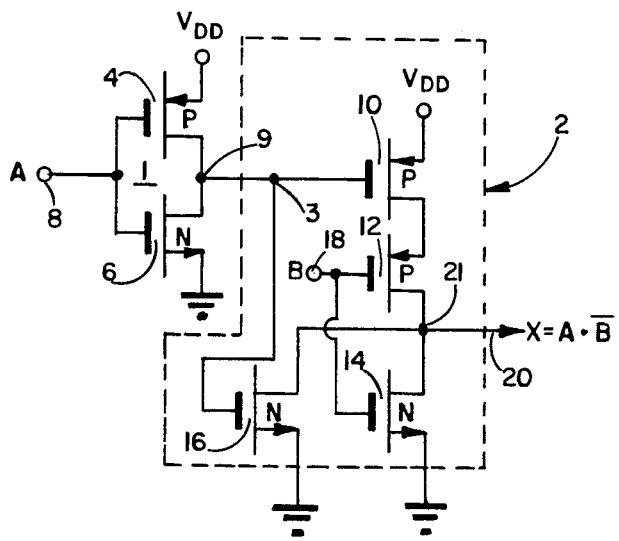
FIG. 1a (PRIOR ART)
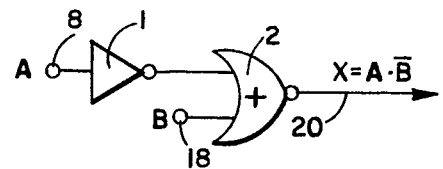
FIG. 1b (PRIOR ART)
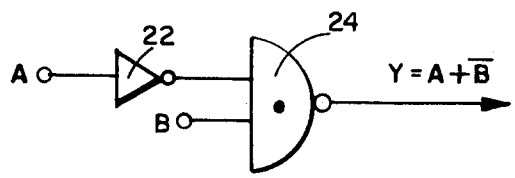
FIG. 2 (PRIOR ART)
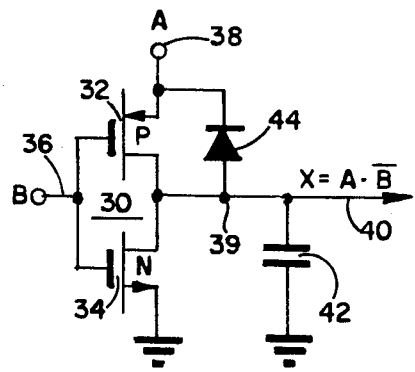
FIG. 3a
FIG. 3b
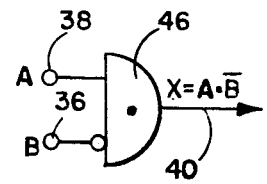
FIG. 3c

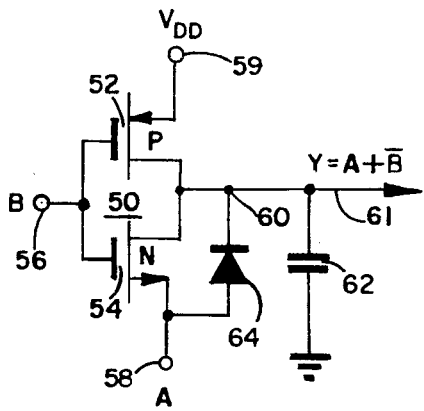
FIG. 4a
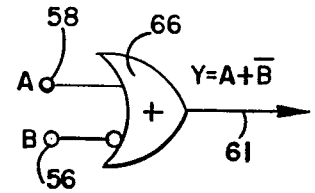
FIG. 4b
FIG. 4c
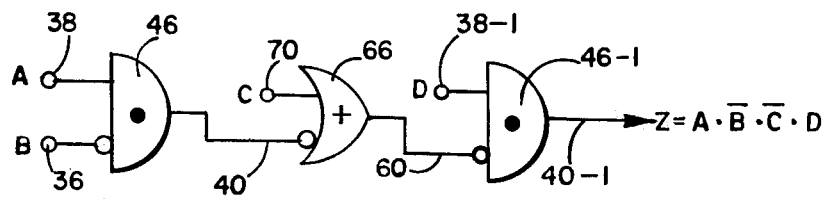
FIG. 5

CMOS BOOLEAN LOGIC MECHANIZATION

BACKGROUND OF THE INVENTION

1. Field of the Invention

This invention relates to a high speed circuit employing diodes and metal oxide semiconductor devices which are fabricated from silicon-on-sapphire integrated circuit techniques and are uniquely arranged to perform functions of Boolean logic.

2. Background of the Invention

Functions of Boolean logic may be mechanized by a suitable arrangement of conventional logic gates. When it becomes necessary to perform certain logic functions having a binary NOT term in the output thereof (e.g. A·B̄ or A+B̄), the logic of the prior art is generally mechanized by a first inverter-amplifier gate and a second suitable NOR gate or NAND gate. An example of this prior art technique for performing the aforementioned Boolean logic can be found in copending application, Ser. No. 513,366, filed Oct. 9, 1974, and assigned to the present assignee.

The prior art gating arrangement requires the use of a relatively large number of transistor devices and interconnections therebetween in order to perform the intended Boolean function. Hence, the space consumed by the logic circuitry and the cost thereof is relatively large. Moreover, the large number of transistor devices inherently increases the time delay for charging or discharging data nodes in order to perform the Boolean function which consequently slows the operating speed of the circuit.

SUMMARY OF THE INVENTION

Briefly and in general terms, unique high speed circuits for mechanizing functions of Boolean logic are disclosed. The circuitry includes an inverter means having first and second input terminals thereof. The inverter includes a complementary pair of semiconductive devices, such as metal oxide semiconductor field effect transistors. The source electrode of one of the pair of field effect transistors is arranged to comprise the first inverter input terminal. The first inverter input terminal is adapted to receive a first binary input signal. The first inverter input terminal can appear as either a current source or a current sink with respect to an out-put node of the instant circuitry. The first inverter input terminal selectively charges or discharges the inverter output node and the circuit load means so as to perform the intended logic. The control (i.e., gate) electrodes of each complementary field effect transistor are connected together at a point comprising the second inverter input terminal. The second inverter input terminal is adapted to receive a second binary input signal. The drain electrodes of each complementary field effect transistor are connected together and to the inverter output node. A unidirectional current means, such as a diode, is connected between the inverter output node and the first inverter input terminal.

In a preferred embodiment, the diode means and the complementary pair of field effect transistors comprising the inverter means may be fabricated from silicon-on-sapphire integrated circuit techniques.

BRIEF DESCRIPTION OF THE DRAWINGS

FIGS. 1a and 1b respectively show the prior art circuit and the correponding logic gating symbology for mechanizing a certain function of Boolean logic;

FIG. 2 shows the prior art logic gating symbology representing another function of Boolean logic;

FIG. 3a is a schematic of the improved, high speed circuit of the instant invention for mechanizing the Boolean function performed by the logic arrangement of FIG. 1b;

FIG. 3b shows the truth table corresponding to the operation of the circuit of FIG. 3a;

FIG. 3c shows the logic gating symbology representing the Boolean function performed by the improved circuit of FIG. 3a;

FIG. 4a is a schematic of another improved, high speed circuit of the instant invention for mechanizing the Boolean function performed by the logic arrangement of FIG. 2;

FIG. 4b shows the truth table corresponding to the operation of the circuit of FIG. 4a;

FIG. 4c shows the logic gating symbology representing the Boolean function performed by the improved circuit of FIG. 4a; and FIG. 5 shows one arrangement wherein the improved logic gates of the instant invention may be cascaded so as to perform another function of Boolean logic.

DESCRIPTION OF THE PREFERRED EMBODIMENT

FIG. 1a shows a prior art circuit technique for mechanizing the Boolean logic function A·B̄. The prior art circuit is comprised of a conventional inverter-amplifier gate 1 and a conventional NOR gate 2. The conventional inverter gate 1 includes a complementary pair of field effect transisitors 4 and 6, designated P and N, respectively. The control electrodes of each of the pair of field effect transistors 4 and 6 are connected together and to a first inverter input terminal 8. A binary input signal (designated A for convenience) is applied to input terminal 8 and to control electrodes of the field effect transistors 4 and 6. An output terminal 9 of the inverter gate 1 is connected to an input terminal 3 of the NOR gate 2.

The conventional NOR gate 2 includes a first pair of P-channel field effect transistors 10 and 12 (designated P) and a second pair of N-channel field effect transistors 14 and 16 (designated N). The output terminal 9 of the inverter gate 1 is connected through input terminal 3 to the control electrodes of a first pair of opposite conductively type field effect transistors 10 and 16 of the NOR gate 2. A second input terminal 18 is connected to the control electrodes of a second pair of opposite conductivity type field effect transistors 12 and 14 of NOR gate 2. A binary input signal (designated B for convenience) is applied to input terminal 18 and to the control electrodes of field effect transistors 12 and 14, as shown. Output means 20 is connected to an output node 21 of NOR gate 2 and a binary output signal (conveniently designated X) can be detected thereat. The operation of inverter gate 1 and NOR gate 2 are well known and a detailed description thereof is not deemed essential.

The prior art techniques for mechanzing the Boolean function A·B̄ by a circuit comprised of an inverter-amplifier gate 1 and a NOR gate 2 requires the utilization of at least six field effect transistors or similar semiconductor devices, as illustrated in FIG. 1a. Hence, the circuit employs a relatively large number of components and interconnections therebetween which consume a correspondingly large area. Moreover, the number of field effect transistors comprising NOR gate 2 causes a relatively large time delay for charging or discharging output node 21 in order to perform the logic represented thereby.

FIG. 1b shows a conventional and relatively complex logic gating symbology corresponding to the prior art circuit of FIG. 1a.

FIG. 2 shows a conventional and relatively complex logic gating symbology corresponding to circuitry (not shown) for mechanizing the Boolean function A+B̄. The prior art circuit technique for mechanizing the aforementioned logical function A+B̄ utilizes the same number of field effect transistors (six) to comprise an amplifier-inverter gate 22 and NAND gate 24 having the same inherent disadvantages as that described with reference to the circuitry of FIG. 1a.

In accordance with the instant invention, FIG. 3a shows the unique, high speed and relatively simplifed logic circuit for mechanizing the Boolean function A·B̄. The instant circuitry includes an inverter-amplifier gate 30. Inverter 30 is comprised of a pair of complementary three-terminal semiconductive devices, such as P-channel and N-channel metal oxide semiconductor (MOS) field effect transistors (FETs) 32 and 34, or the like, designated P and N, respectively.

However, the source electrode of field effect transistor 32 is connected to an inverter input terminal 38. A first binary input signal, A, is applied to inverter input terminal 38. The control or gate electrodes of the complementary pair of field effect transistors 32 and 34 are connected together and to a second inverter input terminal 36. A second binary input signal, B, is applied to input terminal 36. The source electrode of field effect transistor 34 is connected to a source of reference potential, such as ground. The drain electrodes of the complementary field effect transistors 32 and 34 are connected together and to an inverter output node 39 via circuit means 40. A unidirectional current means, such as diode 44, is connected across field effect transistor 32 in order to provide clamping of the output mode 39. Thus, the binary signal to be detected at output node 39 can be held at a binary zero or ground level whenever binary input signal A is false or a LO logic level.

The anode electrode of diode means 44 is connected at a common junction with inverter output node 39 and the drain electrodes of the complementary FETs 32 and 34. The cathode electrode of diode means 44 is connected at a common junction with the source electrode of field effect tansistor 32 and the inverter input terminal 38, as shown. The diode means 44 and the complementary pair of MOSFETs 32 and 34 in a preferred embodiment may be fabricated from a layer of silicon on a sapphire substrate (SOS) with conventional integrated circuit techniques.

A load to be driven by the instant circuit, represented by capacitance means 42, is connected between the inverter output node 39 and the source of reference potential such as ground.

In operation, inverter input terminal 38 of the present embodiment can appear as either a current source or a current sink relative to the instant circuit output node 39 in order to accordingly charge or discharge output node 39 and perform the corresponding logic. A more detailed description of the operation of inverter input terminal 38 as either a current source or a current sink will be disclosed hereinafter.

The operation of the simplified circuit shown in FIG. 3a may be better understood by concurrent reference to the truth table of FIG. 3b. As indicated therein, the binary output signal, X, at output node 39 will be relatively false or a LO logic level voltage (e.g., within 1 volt of ground) at all times except when the binary input signal A is relatively true or a HI logic level (e.g., $V_{DD}$, such as a voltage between 3 to 15 volts d.c.) and the binary input signal B is relatively false or a LO logic level. During this aforementioned example, the LO level voltage of binary input signal B is supplied from terminal 36 to the control electrodes of complementary FETs 32 and 34. As a result, FET 32 is rendered conducting and FET 34 is rendered non-conducting, whereupon terminal 38 serves as a current source relative to output node 39. A current path is thereby created from input terminal 38, through the source-drain conduction path FET 32 to the inverter output node 39 to charge node 39 and capacitive load 42 to a relatively HI logic level voltage. Hence, the corresponding binary output signal X detected at output node 39 is then true or a HI logic level voltage.

The binary input signal A which is to be applied to input terminal 38 in the present example must have sufficient driving capability to charge load capacitor 42 through FET 32. Consequently, the impedance of the source (not shown) driving input terminal 38 and the dimensions of FET 32 are chosen with regard to the size of the load represented by capacitor 42. Terminal 38 can be connected to a suitable signal generator that may be disposed outside a semiconductive chip having the instant circuit.

As a second example, if relatively false or LO logic level input signals A and B are applied to inverter input terminals 38 and 36, respectively, both FETs 32 and 34 are rendered non-conducting. During this example, terminal 38 appears as a current sink relative to the output node 39, and output node 39 is clamped to a LO level voltage by diode 44. A principle current path is thereby created to discharge capacitor 42 through diode 44, which is then forward biased by means of input terminal 38. Hence, the corresponding binary output signal X detected at output terminal 39 is relatively false or a LO logic level voltage.

The operation of the circuit of the instant invention when performing the logic for the remaining binary input conditions described by the truth table of FIG. 3b will be apparent to those skilled in the art.

FIG. 3c shows the preferred logic symbology corresponding to the instant circuit of FIG. 3a for mechanizing the Boolean function A·B̄.

The logic mechanization, as just described, may be employed, for example, in arrangements utilizing input or output drive circuitry. As one example, the simplified circuit of FIG. 3a may be utilized to perform logic in the memory output circuit which is shown in copending patent application, Ser. No. 513,366, filed Oct. 9, 1974, and assigned to the present assignee. As another example, but not to be regarded as a limitation, the instant logic circuitry may also be employed in an arrangement with an internal clock signal generator. In this latter configuration, the clock generator is adapted to provide an enabling signal common to respective input terminals of other logic gates (not shown) having a suitable source impedance.

FIG. 4a shows a unique, high speed and simplified logic circuit formed in accordance with another embodiment of the instant invention. The circuit of FIG. 4a mechanizes the Boolean function A+B̄. The instant circuit includes an inverter-amplifier gate 50. Inverter gate 50 is comprised of a pair of complementary three-terminal semiconductive devices, such as P-channel and N-channel metal oxide semiconductor field effect transistors 52 and 54, or the like, designated P and N, respectively.

The source electrode of FET 52 is connected to a terminal 59. Terminal 59 is adapted to receive a reference potential, $V_{DD}$, which may generally be in a range of 3 to 15 volts d.c. The source electrode of FET 54 is connected to inverter input terminal 58. Input terminal 58 is adapted to receive a first binary input signal, A. The control or gate electrodes of the complementary pair of field effect transistors 52 and 54 are connected together and to a second inverter input terminal 56. Input terminal 56 is adapted to receive a second binary input signal, B. The drain electrodes of the complementary FETs 52 and 54 comprising inverter 50 are connected together and to an inverter output node 60 via circuit means 61. A unidirectional current means, such as diode 64, is connected across field effect transistor 54 in order that the binary signal to be detected at output node 60 can be held at a binary one or HI logic when binary input signal A is true or a HI logic level.

The cathode electrode of diode means 64 is connected at a common junction with inverter output node 60 and the drain electrodes of complementary FETs 52 and 54. The anode electrode of diode means 64 is connected at a common junction with the source electrode of FET 54 and inverter input terminal 58, as shown. The diode means 64 and the complementary pair of MOSFETs 52 and 54 of the instant preferred embodiment may be fabricated from a layer of silicon on a sapphire substrate with conventional integrated circuit techniques.

A load to be driven by the instant circuit, represented by capacitance means 62 is connected between the inverter output node 60 and a source of reference potential, such as ground.

In operation, inverter input terminal 58 of the present embodiment can appear as either a current source or a current sink relative to the instant circuit output node 60 in order to accordingly charge or discharge output node 60 a perform the corresponding logic. A more detailed description of the operation of inverter input terminal 58 as either a current source or a current sink will be discussed hereinafter.

The operation of the simplified circuit shown in FIG. 4a may be better understood by concurrent reference to the truth table of FIG. 4b. As indicated therein, the binary output signal, Y, at output node 60 is relatively true or a HI logic level voltage (e.g., $V_{DD}$) at all times except when the binary input signal A is relatively false or a LO logic level voltage (e.g., within 1 volt of ground) and the binary input signal B is relatively true or a HI logic level voltage. During this aforementioned example, the HI level voltage of binary input signal B is supplied from terminal 56 to the control electrodes of complementary FETs 52 and 54. As a result, FET 52 is rendered non-conducting and FET 54 is rendered conducting, whereupon terminal 58 serves as a current sink relative to output node 60. A current path is thereby created to discharge capacitor 62 through the source-drain conduction path of FET 54 and through input terminal 58. Hence, the corresponding binary output signal Y detected at output node 60 is relatively false or a LO logic level voltage.

As a second example, if both binary input signals A and B applied to inverter input terminals 58 and 56, respectively, are relatively true or a HI level voltage (e.g., $V_{DD}$), both FET 52 and FET 54 are rendered non-conducting. During this example, terminal 58 appears as a current source relative to output node 60. A principle current path is thereby created from input terminal 58, through diode means 64, which is then forward biased, and to the inverter output node 60 to charge output node 60 and capacitive load 62 to a HI logic level voltage. Thus, the corresponding binary output signal detected at output node 60 is relatively true or a HI logic level voltage.

The operation of the circuit of the instant invention when performing the logic for the remaining binary input conditions described by the truth table of FIG. 4b will be apparent to those skilled in the art.

FIG. 4C shows the preferred logic symbology corresponding to the instant circuit of FIG. 4a for mechanizing the Boolean logic function A+B̄.

FIG. 5 shows one arrangement wherein the simplified logic gates may be cascaded to perform other functions of Boolean logic. For example, a first gate 46, formed in accordance with the instant invention and described at FIG. 3c, is shown having input terminals 38 and 36. Binary input signals A and B are applied to terminals 38 and 36, respectively. The output signal from gate 46 is applied to one input terminal of gate 66, formed in accordance with the instant invention and described in FIG. 4c, via line 40. Terminal 70 forms a second input to gate 66 and is adapted to receive a binary input signal, C. The output binary signal from gate 66 is applied to one input terminal of gate 46-1, formed in accordance with the instant invention, by means of line 60. Terminal 38-1 forms a second input to gate 46-1 and is adapted to receive a binary input signal, D. The binary input signals to be applied to terminals 38, 70 and 38-1 are generated with sufficient drive capability to enable these input terminals to appear as either a current source or a current sink depending upon the binary input conditions to be satisfied at the respective logic gates. Thus, a binary output signal, Z, on line 40-1 satisfies the Boolean logic function A·B̄·C̄·D in a manner similar to that previously disclosed. Although only one example is illustrated for cascading the logic gates of the instant invention, it is to be understood that the instant logic arrangement may be modified by additional combinations thereof so as to mechanize any other suitable function of Boolean logic.

Unique circuits are provided by using CMOS/SOS and integrated circuit techniques to mechanize the functions of Boolean logic X=A·B̄ and Y=A+B̄ and suitable combinations thereof. The instant circuits have been simplified and improved so as to minimize both the number of required components to perform the logic and the space consumed thereby. Hence, the speeds for performing the logic can be increased while the cost of the circuitry can be reduced.

It will be apparent that while preferred embodiments of the invention have been shown and described, various modifications and changes may be made without departing from the true spirit and scope of the invention. For example, in a preferred embodiment, the complementary pair of FETs comprising the inverter-amplifier are fabricated by silicon-on-sapphire techniques. However, it is to be understood that the FETs employed in the instant invention may be fabricated by an other suitable well known technique, such as by dielectric isolation and the like. Moreover, it should be understood that the signals and signal levels, per se, are not intended to be limitative of the invention. The terms "true" or "HI level" are intended to be interchangeable. These terms are also intended to be relative only and not to establish actual values. The signal value may be positive or negative depending upon whether positive or negative logic is utilized.

It is to be additionally understood that the unidirectional current means previously disclosed in FIGS. 3a and 4a may comprise a three-terminal semiconductor device such as that connected in a conventional source-follower configuration with respect to the inverter gate. As one example only, the aforementioned semiconductor device may be a suitable P or N-channel field effect transistor (not shown) having the source electrode connected to the inverter output node, the gate electrode connected to an inverter input terminal, and the drain electrode connected to a source of reference potential.

These and other features of the description are for illustrative purposes only. Any other modifications which fall within the purview of this description are intended to be covered thereby.

Having thus described a preferred embodiment of the invention, what is claimed is:

1. A logic circuit for performing a Boolean logic function including
    inverter means having first and second three-terminal opposite conductivity type semiconductor devices,
    a first terminal of said first semiconductor device comprising a first inverter input terminal, said first inverter input terminal adapted to receive a first binary input signal,
    a corresponding first terminal of said second semiconductor device connected to a first reference source means,
    corresponding second terminals of each of said first and second semiconductor devices connected together to comprise a second inverter input terminal, said second inverter input terminal adapted to receive a second binary input signal,
    an inverter output node,
    corresponding third terminals of each of said first and second semiconductor devices connected together and to said inverter output node, said output node adapted to be selectively charged or discharged through said first inverter input terminal to provide an output signal indicative of the binary state of the logic to be performed, and
    unidirectional current conducting means connected between said first inverter input terminal and said inverter output node and across the conduction path of said first semiconductor device.

2. The circuit of claim 1, wherein said first and second semiconductor devices are a pair of complementary metal oxide semiconductor field effect transistors.

3. The circuit of claim 2, wherein each of said field effect transistors has source, gate and drain electrodes corresponding to said first, second and third terminals, respectively.

4. The circuit of claim 2, wherein said pair of field effect transistors are fabricated from a layer of silicon on a sapphire substrate.

5. The circuit of claim 1, wherein said unidirectional current conducting means is a diode having anode and cathode electrodes thereof.

6. The circuit of claim 5, wherein said Boolean function to be mechanized includes the operation of a logical AND,
    said inverter output node selectively discharged through the conduction path of said diode,
    said anode electrode of said diode connected at a common junction with said inverter output node and the corresponding third terminals of each of said semiconductor devices,
    said cathode electrode of said diode connected to said first inverter input terminal.

7. The circuit of claim 5, wherein the Boolean function to be mechanized includes the operation of a logical OR,
    said inverter output node selectively charged through the conduction path of said diode.
    said cathode electrode of said diode connected at a common junction with said inverter output node and the corresponding third terminals of each of said semiconductor devices,
    said anode electrode of said diode connected to said first inverter input terminal.

8. The circuit of claim 5, wherein said diode is fabricated from a layer of silicon on a sapphire substrate.

9. The circuit of claim 1, including a capacitive load means, said capacitive load means connected between said inverter output node and a second reference source means, said load means selectively charged or discharged through said output node.

10. The circuit of claim 1, wherein said unidirectional current conducting means is rendered conductive to selectively charge or to discharge said inverter output node to thereby perform the Boolean logic function when each of said first and second binary input signals is of the same logic level.

11. The circuit of claim 10, wherein said inverter output node is selectively discharged through the conduction on path of said unidirectional current conducting means when each of said first and second inverter input terminals receives relatively false logic level signals.

12. The circuit of claim 10, wherein said inverter output node is selectively charged through the conduction path of said unidirectional current conducting means when each of said first and second inverter input terminal receives relatively true logic level signals.

13. A logic circuit comprising
    source means to provide a plurality of reference signals,
    first semiconductor means,
    second semiconductor means,
    each of said first and second semiconductor means having a respective conduction path between first and second terminals thereof and a control electrode for selectively controlling conduction through each of said respective conduction paths,
    first input means connected between said source means and each of said control electrodes,
    output means connected to one of said first and second terminals of each of said first and second semiconductor means,
    second input means connected between said source means and the other terminal of one of said first and second semiconductor means,
    third input means connected between said source means and the other terminal of the other one of said first and second semiconductor means, and
    diode means connected from said second input means to said output means and across the respective conduction path of said one semiconductor means.

14. The logic circuit recited in claim 13, wherein said first and second semiconductor means comprise MOS devices of opposite conductivity type.

15. The logic circuit recited in claim 13, wherein said first and second terminals of said first and second semiconductor means are source and drain electrodes,
   the drain electrodes of said first and second semiconductor means connected together and to said output means, whereby the respective conduction paths of said first and second semiconductor means are connected in series, and
   said diode means connected between the respective source and drain electrodes of said one semiconductor means, such that the conduction paths of said diode means and said one semiconductor means are oppositely poled with respect to one another.

\* \* \* \* \*